(12) United States Patent
Liu (10) Patent No.: US 7,646,344 B2
(45) Date of Patent: Jan. 12, 2010

(54) WAFER-SCALE PHASED ARRAY

(75) Inventor: Duixian Liu, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/045,377

(22) Filed: Mar. 10, 2008

(65) Prior Publication Data

US 2009/0015483 A1    Jan. 15, 2009

Related U.S. Application Data

(60) Provisional application No. 60/949,884, filed on Jul. 16, 2007, provisional application No. 60/949,685, filed on Jul. 13, 2007.

(51) Int. Cl.
*H01Q 1/38* (2006.01)

(52) U.S. Cl. ............................... 343/700 MS; 343/853

(58) Field of Classification Search .......... 343/700 MS, 343/770, 846, 850, 853
See application file for complete search history.

(56) References Cited

U.S. PATENT DOCUMENTS 4,843,400 A * 6/1989 Tsao et al. ............ 343/700 MS
5,923,296 A * 7/1999 Sanzgri et al. ....... 343/700 MS 2008/0029886 A1    2/2008  Cotte et al.

OTHER PUBLICATIONS

D.M Pozar, "Microstrip Antenna Aperture-Coupled to a Microstripline," Electronics Letters, Jan. 17, 1995, pp. 49-50, vol. 21, No. 2.
J.A.G. Akkermans et al., "Design of a Millimeter-Wave Balanced-Fed Aperture-Coupled Patch Antenna," Proc. EuCAP, Nov. 2006, 6 pages.
U.S. Appl. No. 12/130,562, filed in the name of B.A. Floyd et al. on May 30, 2008 and entitled "Method and Apparatus for Packaging an Integrated Chip and Antenna."
U.S. Appl. No. 12/102,051, filed in the name of J.A.G. Akkermans et al. on Apr. 14, 2008 and entitled "Radio Frequency (RF) Integrated Circuit (IC) Packages with Integrated Aperture-Coupled Patch Antenna(s) in Ring and/or Offset Cavities."
U.S. Appl. No. 12/034,023, filed in the name of B.A. Floyd et al. on Feb. 20, 2008 and entitled "Radio Frequency (RF) Integrated Circuit (IC) Packages with Integrated Aperture-Coupled Patch Antenna(s)."

* cited by examiner

*Primary Examiner*—Hoang V Nguyen
(74) *Attorney, Agent, or Firm*—Anne V. Dougherty; Ryan, Mason & Lewis, LLP (57) ABSTRACT

An antenna array includes at least a first and a second substrate; a plurality of radiators located proximate to a surface of the first substrate opposite the second substrate; at least a first ground plane located between the first and the second substrate, the ground plane having a plurality of slots located therein; and a plurality of feed lines located proximate to a surface of the second substrate opposite the first substrate.

20 Claims, 9 Drawing Sheets

WAFER-SCALE PHASED ARRAY

CROSS-REFERENCE TO RELATED APPLICATIONS

This application claims the benefit of U.S. Provisional Application No. 60/949,884, filed Jul. 16, 2007, abandoned and U.S. Provisional Application No. 60/949,685, filed Jul. 13, 2007, the disclosures of which are incorporated by reference herein.

FIELD OF THE INVENTION

The present invention relates generally to planar phased array architectures. Specifically, it is related to wafer-scale planar phased array architectures suitable for millimeter wave (mmWave) frequencies and above.

BACKGROUND OF THE INVENTION

In a wireless network, connectivity and communication between devices is achieved through antennas attached to receivers or transmitters in order to radiate the desired signals to or from other elements of the network. In radio communication systems, such as millimeter-wave radios, discrete components are usually assembled with low integration levels. These systems are often assembled using expensive and bulky waveguides and package-level or board-level microstrip structures to interconnect semiconductors and their required transmitter or receiver antennas.

With recent progress in semiconductor technology and packaging engineering, the dimensions of these radio communication systems have become smaller and integration of antennas with their radio frequency (RF) front-end circuits has become more desirable. For applications such as wireless universal serial bus (USB), the operating distance is limited to about a meter; a single antenna with about 7 dBi at 60 GHz will provide the necessary antenna gains.

However, for point-to-point applications which require operating distances of ten meters (such as wireless video) or longer (such as military radar), antenna gains as high as 30 dBi may be required. However, because high-gain antennas have very narrow beam widths (thereby making it difficult for consumers to accurately point the antenna), phased arrays (also known as radiation pattern steerable arrays) are necessary. As is well-known to one having skill in the art, phased arrays typically comprise array radiating elements (such as microstrip patches, dipoles, folded dipoles and slots); a beam forming network (typically including phase shifters); and a controller.

For example, D. M. Pozar, "A microstrip antenna aperture coupled to a microstrip line," *Electron. Lett.*, vol. 21, pp. 49-50, Jan. 17, 1985, discloses an arrangement wherein a microstrip antenna on one substrate is coupled to a microstripline feed on another parallel substrate through an aperture in the ground plane which separates the two substrates. J. A. G. Akkermans, M. C. van Beurden, and M. H. A. J. Herben, "Design of a Millimeter-Wave Balanced-Fed Aperture-Coupled Patch Antenna," *Proc. 'EuCAP 2006'*, Nice, France, Nov. 6-10, 2006, discloses an arrangement wherein a balanced feed electromagnetically couples to a patch through two separate slots.

SUMMARY OF THE INVENTION

In an illustrative embodiment, an antenna array includes at least a first and a second substrate; a plurality of radiators located proximate to a surface of the first substrate opposite the second substrate; at least a first ground plane located between the first and the second substrate, the ground plane having a plurality of slots located therein; and a plurality of feed lines located proximate to a surface of the second substrate opposite the first substrate.

An exemplary antenna array may also include at least a third substrate such that the second substrate is between the first substrate and the third substrate; and at least a second ground plane located proximate to a surface of the third substrate opposite the second substrate, the second ground plane having at least one feed pad located thereon.

In another illustrative embodiment, an antenna array includes at least a first and a second substrate; a plurality of radiators located proximate to a surface of the first substrate opposite the second substrate; at least a first ground plane located between the first and the second substrate, the ground plane having a plurality of slots located therein; and a plurality of feed lines located proximate to a surface of the second substrate opposite the first substrate. Each of the plurality of slots corresponds to one of the plurality of feed lines. At least a portion of each slot overlays at least a portion of the corresponding feed line. Each feed line is associated with one of the plurality of radiators. Each of the plurality of radiators has at least one feed line associated therewith. At least a portion of each of the plurality of radiators overlays at least a portion of each associated feed line and at least a portion of each of the plurality of radiators overlays each slot corresponding to each associated feed line.

Illustrative embodiments may also provide greater ease of manufacture and cost-effectiveness while also providing superior performance. For example, illustrative embodiments of the present invention may advantageously permit the distance between the antenna element and the back ground plane to be minimized without loss of antenna performance. In an illustrative embodiment, the distance between the antenna structure and the back ground plane can be less than one-tenth of a wavelength.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
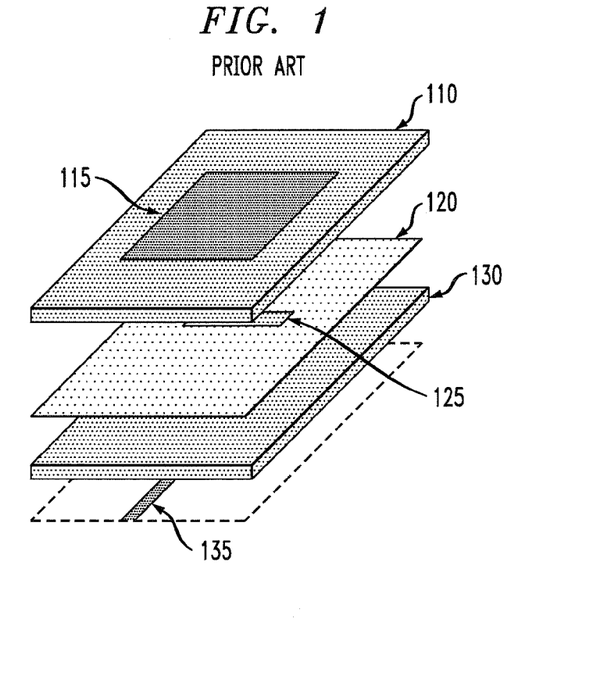
FIG. 1 shows an aperture-coupled patch antenna with a microstrip feed line, according to the prior art.

FIG. 1 shows an aperture-coupled patch antenna with a microstrip feed line similar to that disclosed in D. M. Pozar, "A microstrip antenna aperture coupled to a microstrip line," *Electron. Lett.*, vol. 21, pp. 49-50, Jan. 17, 1985, the disclosure of which is incorporated by reference herein. Specifically, patch antenna 115 on a first substrate 110 is coupled to a microstripline feed 135 on a second substrate 130 through a coupling aperture (or slot) 125 in ground plane 120, which separates the two substrates.

Figure 2:
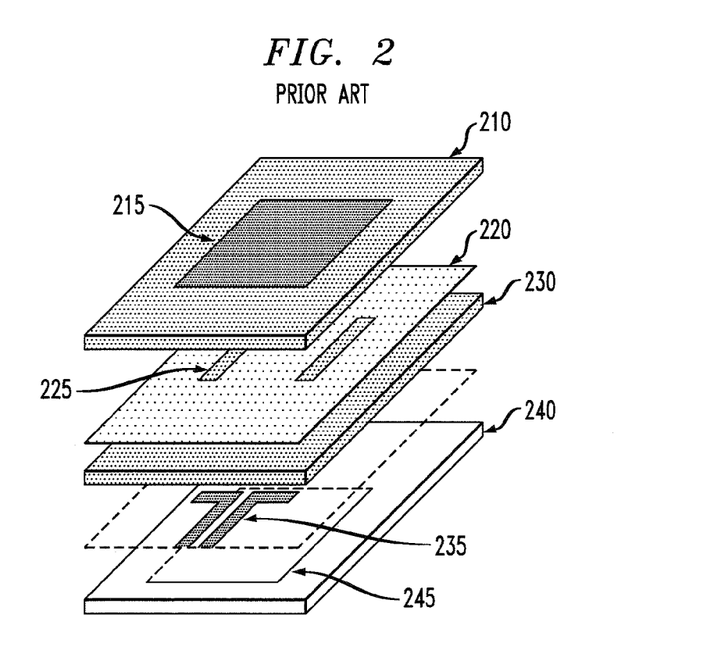
FIG. 2 shows an aperture-coupled patch antenna but with a differential (balanced) feed line, according to the prior art.

FIG. 2 shows an aperture-coupled patch antenna but with a differential (balanced) feed line similar to that disclosed in J. A. G. Akkermans, M. C. van Beurden, and M. H. A. J. Herben, "Design of a Millimeter-Wave Balanced-Fed Aperture-Coupled Patch Antenna," *Proc. 'EuCAP 2006'*, Nice, France, Nov. 6-10, 2006, the disclosure of which is incorporated by reference herein. Specifically, patch antenna 215 on a first substrate 210 is coupled to a balanced, or differential, feed 235 on a second parallel substrate 230 through a pair of coupling apertures, or slots, 225 in ground plane 220, which separates the two substrates.

The antenna bandwidth associated with this design may be improved by stacking another patch (including a substrate) on top of the existing patch. For example, in this embodiment, there is also a third substrate 240 having a reflector element 245, which may be a metal plate or a finite reflector element, coupled thereto. The first and third substrates may be dielectric and the second substrate prepreg. With proper design, the antenna bandwidth can be more than 10%.

Previous silicon-based wafer-scale phased array architectures require a deep cavity and long vias, which may be more than 500 um long or more than ¼ wavelength. These deep cavity and long vias are difficult to make and not reliable at 60 GHz. Moreover, these long vias often function more like a radiator than a transmission line.

Illustrative embodiments of the present invention do not require the use of deep vias and cavities. Moreover, the antenna array can be made with silicon process or high precision printed circuit board (PCB) technology. Accordingly, illustrative embodiments of the present invention provide greater ease of manufacture and cost-effectiveness while also providing superior performance.

While reference may be made herein to certain device components, it is to be understood that the present invention is not limited to these or any particular device components or arrangements thereof. For example, although the embodiments illustrated herein utilize rectangular radiating elements, principles of the present invention may be adapted for use with any number and type of radiator, including but not limited to circular patches, stacked patches, parasitically coupled patches, patches with loading slots, and radiating elements consisting of multiple thin printed dipoles. Likewise, although the embodiments illustrated herein utilize thin rectangular coupling slots, principles of the present invention may be adapted for use with any number and type of apertures or slots, including but not limited to round apertures or slots with enlarged ends, such as "dogbone," bow-tie, or H-shaped apertures. Moreover, although the substrates preferably comprise a single layer of high-resistivity silicon or high-quality printed circuit board (PCB) materials, it is also possible to form substrates from other materials and/or with multiple layers, such as foam with thin dielectric skins for the etched conductors.

Figure 3A:
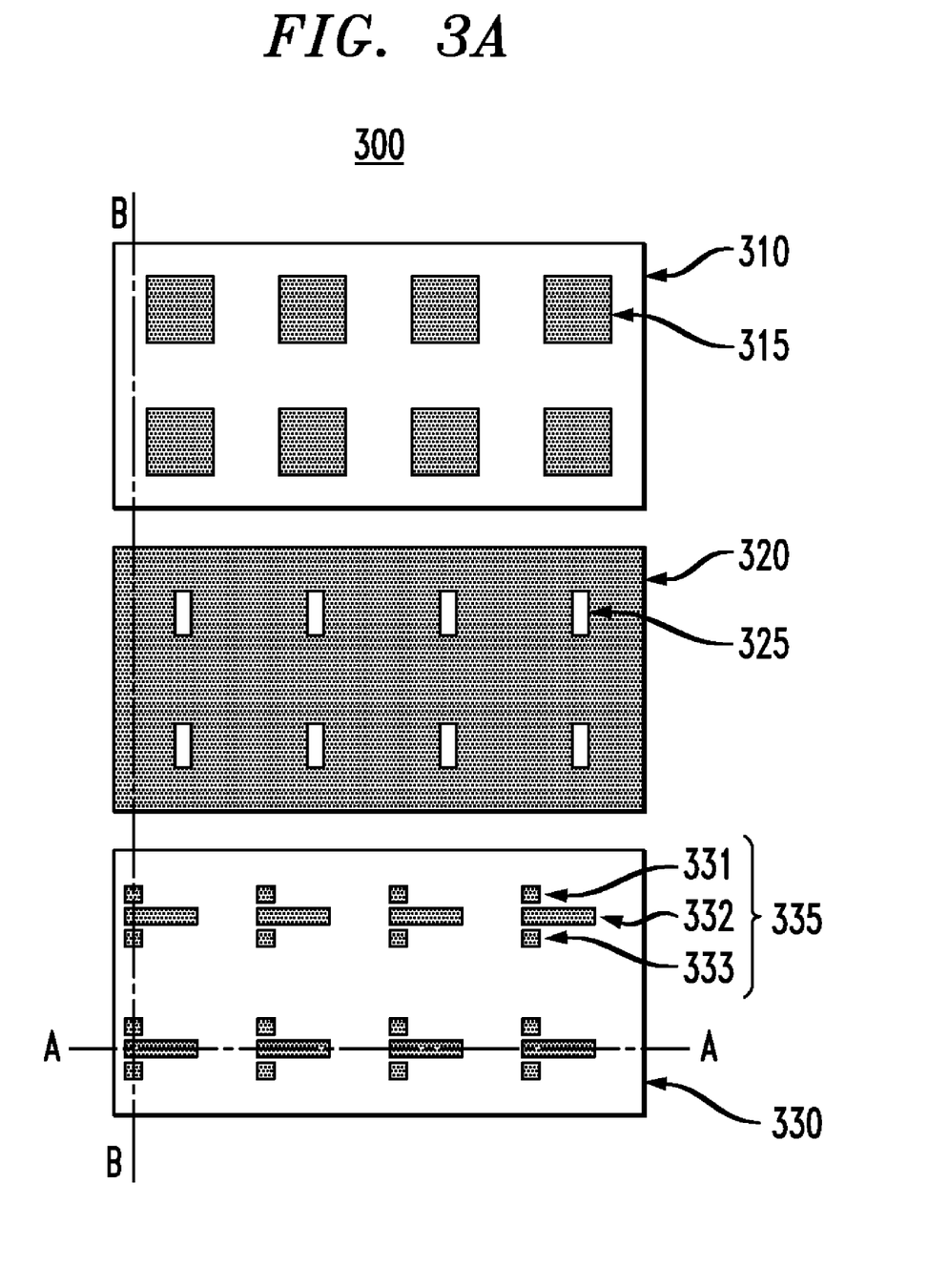
FIG. 3A shows an exploded cross-section of a wafer-scale phased array with a coplanar waveguide (CPW) feed line, according to an aspect of the invention.
Figure 3B:
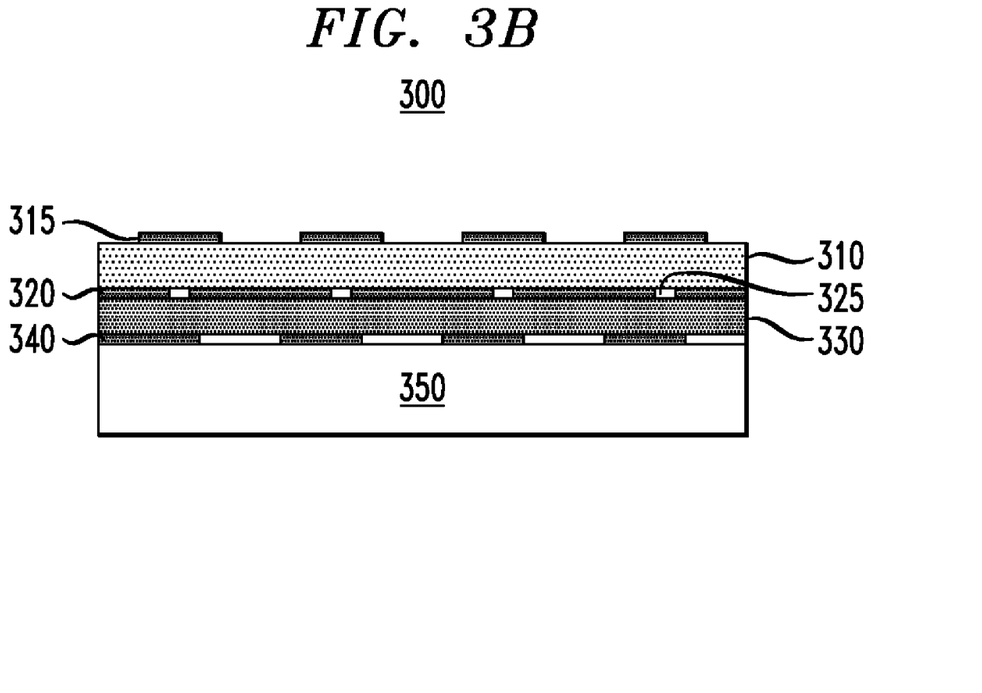
FIG. 3B shows a cross-section of the array of FIG. 3A along the A-A axis, according to an aspect of the invention.
Figure 3C:
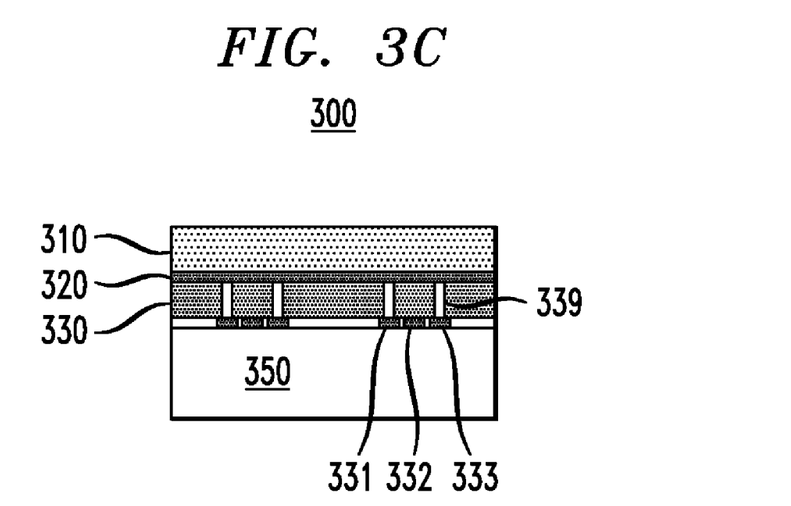
FIG. 3C shows a cross-section of the array of FIG. 3A along the B-B axis, according to an aspect of the invention.

FIG. 3A shows an exploded cross-section of wafer-scale phased array 300 with coplanar waveguide (CPW) feed lines, according to an aspect of the invention. FIG. 3B shows a cross-section of array 300 along the A-A axis, according to an aspect of the invention. FIG. 3C shows a cross-section of array 300 along the B-B axis, according to an aspect of the invention.

More specifically, the antenna array 300 includes a radiator substrate 310 and a feed line substrate 330. Ground plane 320 is located between radiator substrate 310 and feed line substrate 330. Ground plane 320 has slots 325 located therein. Radiators 315 are located on the surface of the radiator substrate 310 which is opposite feed line substrate 330. The antenna array may be coupled to other antenna components 350, such as one or more phase shifters and/or beamforming network controllers.

Feed structures 335 are located proximate to a surface of feed line substrate 330 opposite radiator substrate 310. In this embodiment, each feed structure 335 comprises a coplanar waveguide (CPW) microstrip feed line 332 with two pads 331, 333 associated therewith and located on either side of feed line 332. Via 339 is formed in the feed line substrate 330 between each pad 331, 333 of the feed line structure and ground plane 320. Moreover, there is a slot 325 located between each radiator 315 and a corresponding feed line 332 such that each radiator 315 overlays a slot 325 and a portion of the corresponding feed line 332 but does not overlay pads 331, 333.

Figure 4A:
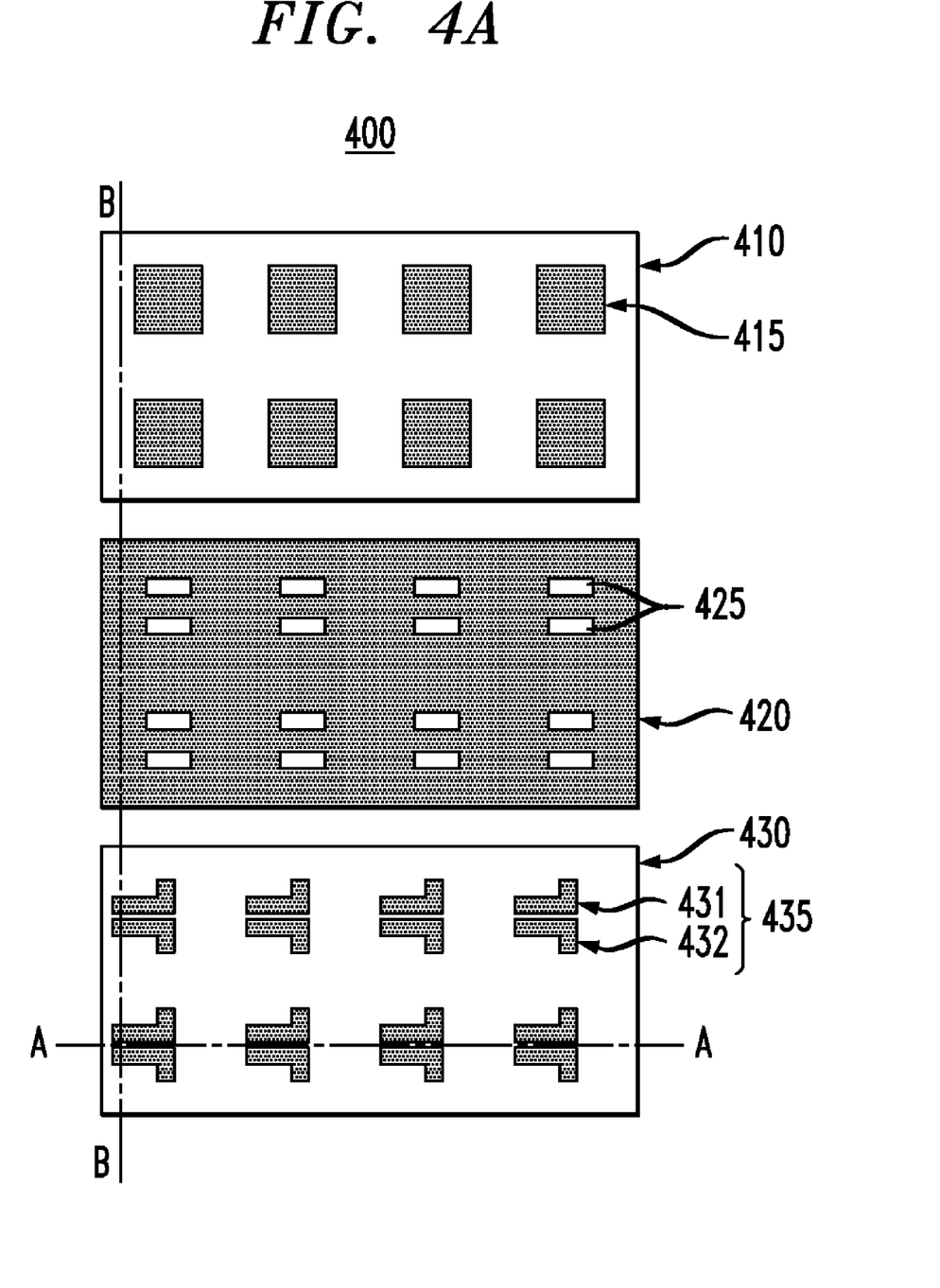
FIG. 4A shows an exploded cross-section of a wafer-scale phased array with a coplanar strip (CPS) feed line, according to an aspect of the invention.
Figure 4B:
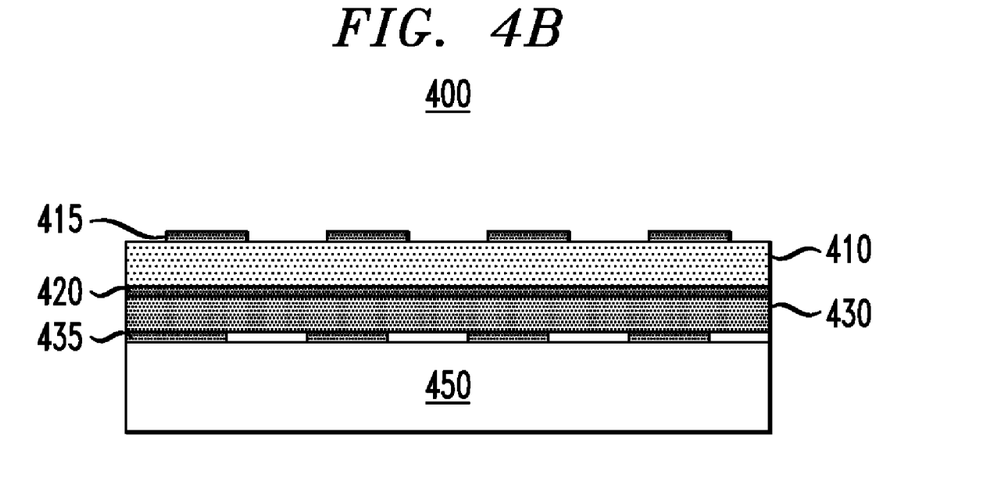
FIG. 4B shows a cross-section of the array of FIG. 4A along the A-A axis, according to an aspect of the invention.
Figure 4C:
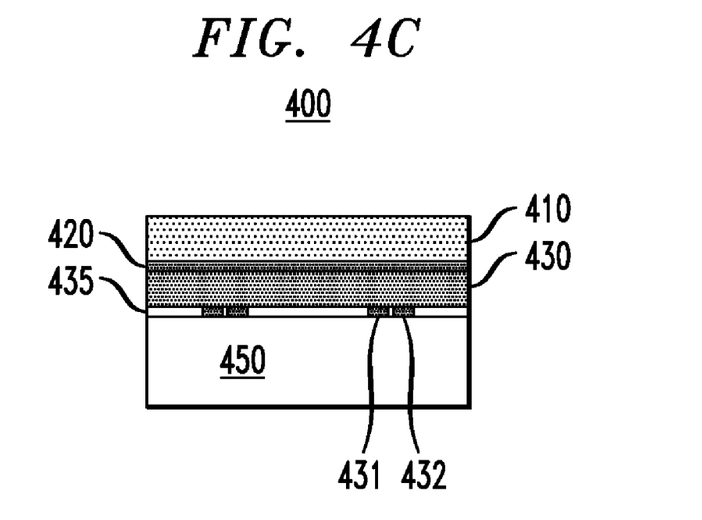
FIG. 4C shows a cross-section of the array of FIG. 4A along the B-B axis, according to an aspect of the invention.

FIG. 4A shows an exploded cross-section of wafer-scale phased array 400 with coplanar strip (CPS) feed lines, according to an aspect of the invention. FIG. 4B shows a cross-section of array 400 along the A-A axis, according to an aspect of the invention. FIG. 4C shows a cross-section of array 400 along the B-B axis, according to an aspect of the invention.

More specifically, antenna array 400 includes a radiator substrate 410 and a feed line substrate 430. Ground plane 420 is located between radiator substrate 410 and feed line substrate 430. Ground plane 420 has slots 425 located therein. Radiators 415 are located on the surface of the radiator substrate 410 which is opposite feed line substrate 430. The antenna array may be coupled to other antenna components 450, such as one or more phase shifters and/or beamforming network controllers.

Feed structures 435 are located proximate to a surface of feed line substrate 430 opposite radiator substrate 410. In this embodiment, each feed structure 435 comprises two coplanar strip (CPS) feed lines 431, 432. Feed structure 435 may also include, for example, one or more balanced feed lines, differential feed lines, and/or dipole structures. There is a slot 425 located between each radiator 415 and each dipole structure 431, 432 of the corresponding feed structure 435, such that each radiator 415 overlays at least a portion of dipole structures 431, 432, as well as the slots 425 associated with each of dipole structures 431, 432.

Antenna arrays 300 and 400 are suitable for use where electromagnetic interference (EMI) is not of concern. However, it may be desirable to add a reflector or isolation plane, comprising an insulated ground plane with feed pads disposed thereon. This ground plane with feed pads insulates the antenna array from active devices, thus reducing the EMI effects.

Figure 5A:
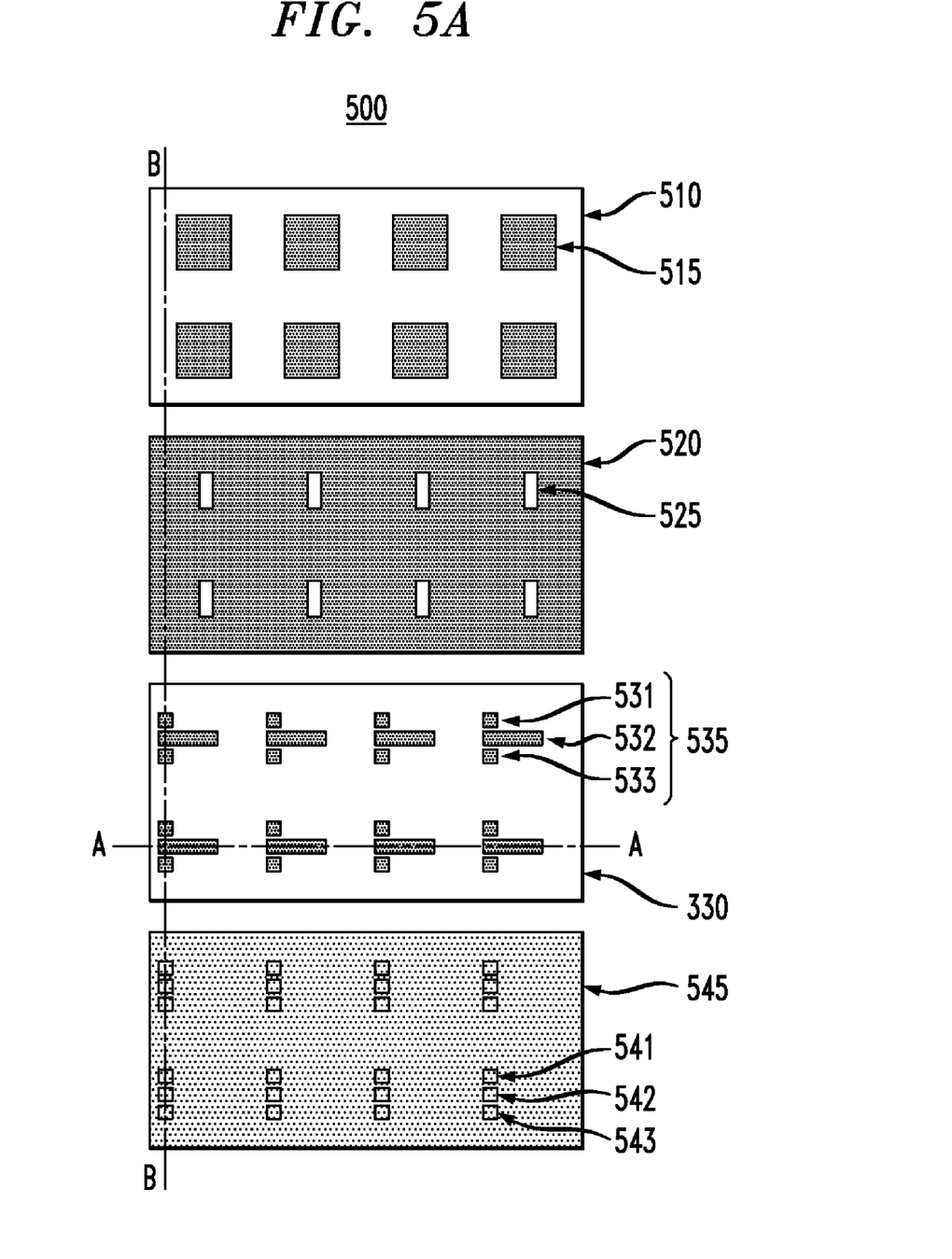
FIG. 5A shows an exploded cross-section of a wafer-scale phased array with a coplanar waveguide (CPW) feed line and a reflector, according to an aspect of the invention.
Figure 5B:
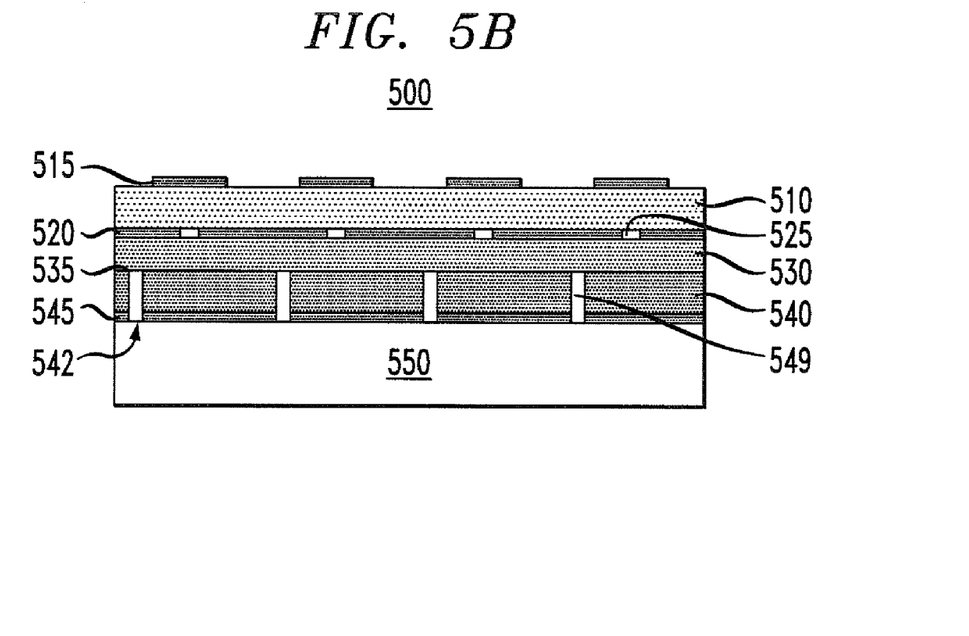
FIG. 5B shows a cross-section of the array of FIG. 5A along the A-A axis, according to an aspect of the invention.
Figure 5C:
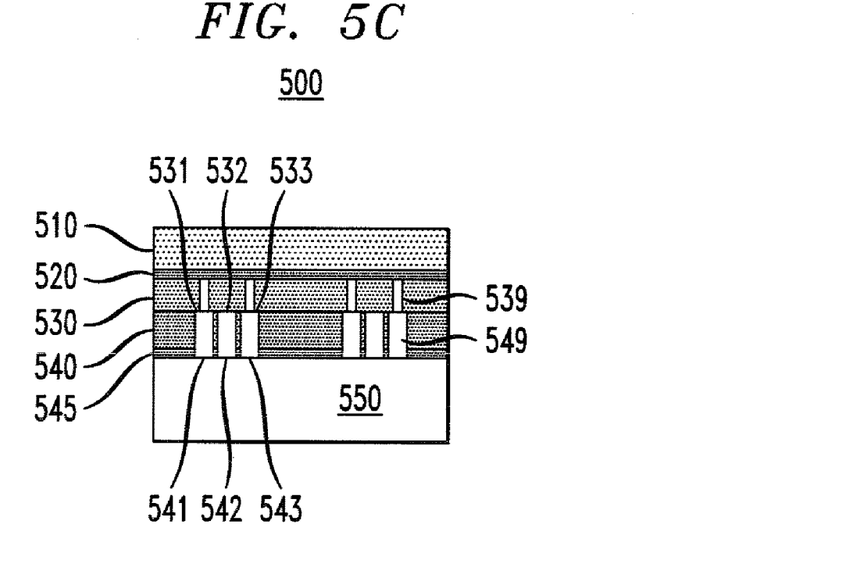
FIG. 5C shows a cross-section of the array of FIG. 5A along the B-B axis, according to an aspect of the invention.

FIG. 5A shows an exploded cross-section of wafer-scale phased array 500 with a coplanar waveguide (CPW) feed line and a reflector, according to an aspect of the invention. FIG. 5B shows a cross-section of array 500 along the A-A axis, according to an aspect of the invention. FIG. 5C shows a cross-section of array 500 along the B-B axis, according to an aspect of the invention.

More specifically, antenna array 500 includes a radiator substrate 510 and a feed line substrate 530. Ground plane 520 is located between radiator substrate 510 and feed line substrate 530. Ground plane 520 has slots 525 located therein. There are radiators 515 located on the surface of the radiator substrate 510 which is opposite feed line substrate 530. Insulation substrate 540 is located such that the feed line substrate 530 is between the radiator substrate 510 and the insulation substrate 540. Isolation plane 545 is a ground plane located proximate to a surface of insulation substrate 540 opposite feed line substrate 530. The antenna array may be coupled to other components 550, such as one or more phase shifters and/or beamforming network controllers.

Feed structures 535 are located proximate to a surface of feed line substrate 530 opposite radiator substrate 510. In this embodiment, each feed structure 535 comprises a coplanar waveguide (CPW) microstrip feed line 532 with two pads 531, 533 associated therewith and located on either side of feed line 532. Via 539 is formed in feed line substrate 530 between each pad 531, 533 of feed line structure 535 and ground plane 520. Moreover, there is a slot 525 located between each radiator 515 and a corresponding feed line 532 such that each radiator 515 overlays a slot 525 and a portion of the corresponding feed line 532 but does not overlay pads 531, 533.

Isolation plane 545 has groups of three pads 541, 542, 543 formed thereon, such that each pad corresponds to a component of a feed line structure. Pad 541 corresponds to pad 531; pad 542 corresponds to feed line 532; and pad 543 corresponds to pad 533. Moreover, there is a via 549 formed in insulation substrate 540 between each pad 541, 542, 543 on isolation plane 545 and each component 531, 532, 533 of feed structure 535 on feed line substrate 530. Radiator 515 does not overlay pads 541, 542, 543.

Figure 6A:
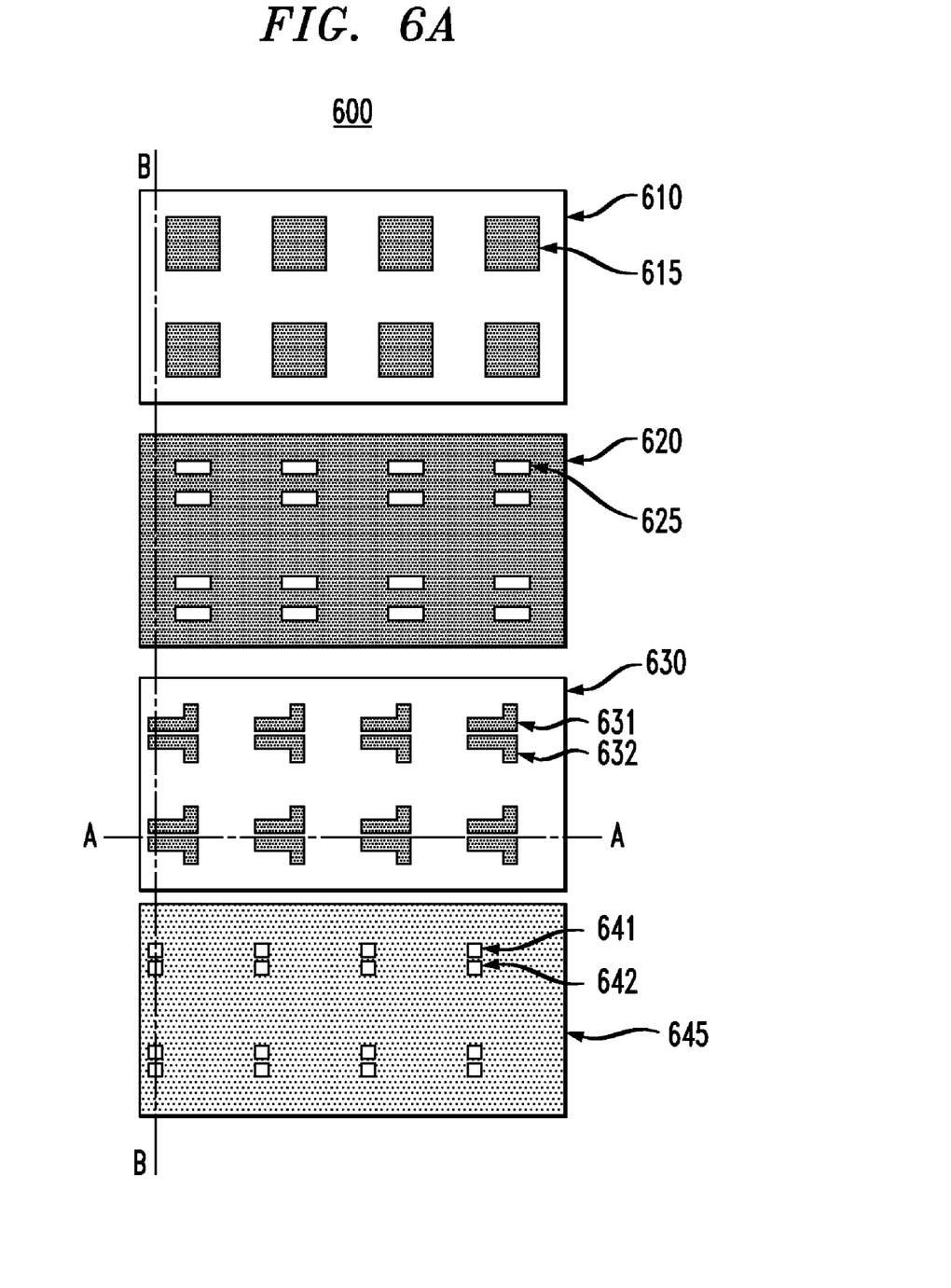
FIG. 6A shows an exploded cross-section of a wafer-scale phased array with a coplanar strip (CPS) feed line and a reflector, according to an aspect of the invention.
Figure 6B:
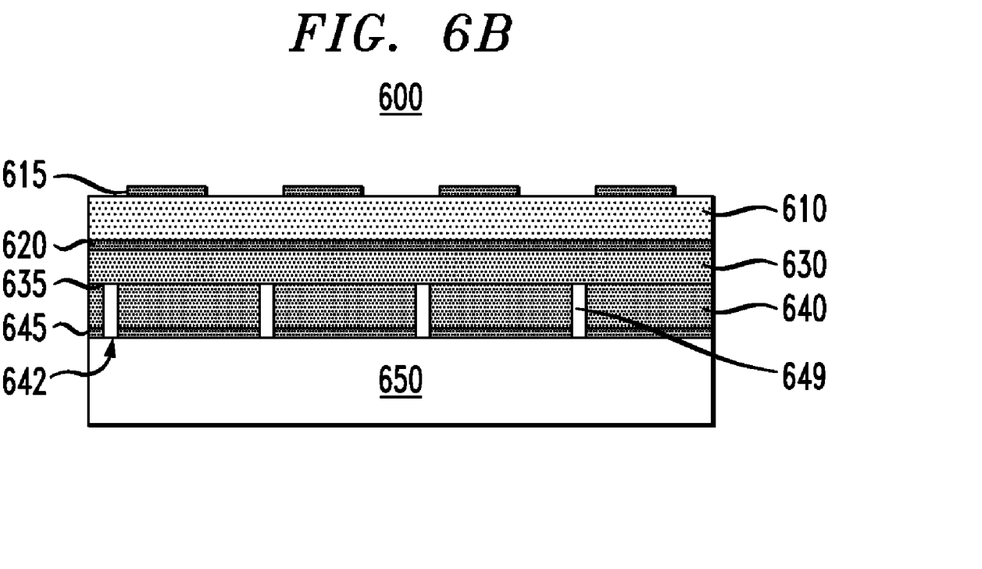
FIG. 6B shows a cross-section of the array of FIG. 6A along the A-A axis, according to an aspect of the invention.
Figure 6C:
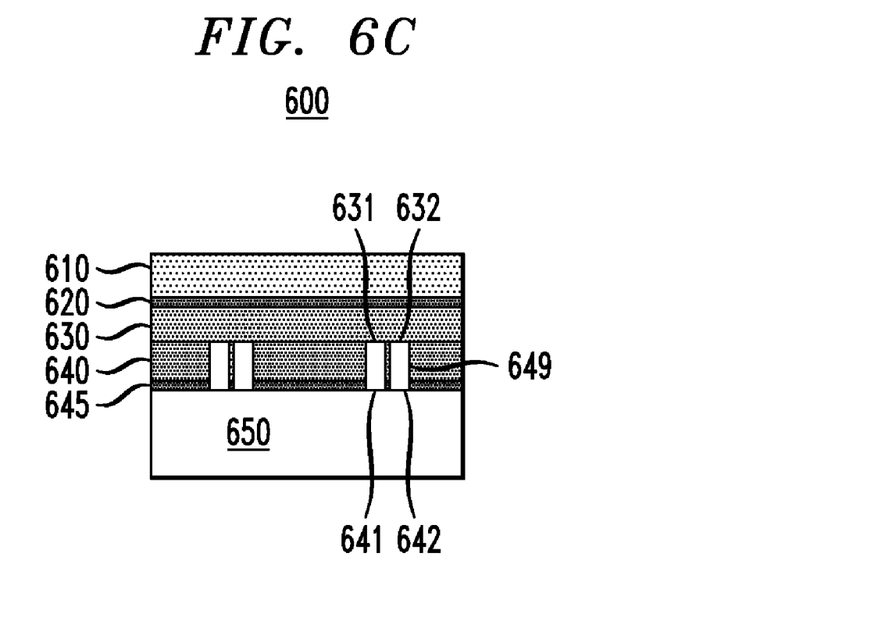
FIG. 6C shows a cross-section of the array of FIG. 6A along the B-B axis, according to an aspect of the invention.

FIG. 6A shows an exploded cross-section of wafer-scale phased array 600 with a coplanar strip (CPS) feed line, according to an aspect of the invention. FIG. 6B shows a cross-section of array 600 along the A-A axis, according to an aspect of the invention. FIG. 6C shows a cross-section of array 600 along the B-B axis, according to an aspect of the invention.

More specifically, antenna array 600 includes a radiator substrate 610 and a feed line substrate 630. Ground plane 620 is located between radiator substrate 610 and feed line substrate 630. Ground plane 620 has slots 625 located therein. There are radiators 615 located on the surface of the radiator substrate 610 which is opposite feed line substrate 630. Insulation substrate 640 is located such that feed line substrate 630 is between radiator substrate 610 and insulation substrate 640. Isolation plane 645 is a ground plane located proximate to a surface of insulation substrate 640 opposite feed line substrate 630. The antenna array may be coupled to other antenna components 650, such as one or more phase shifters and/or beamforming network controllers.

Feed structures are located proximate to a surface of feed line substrate 630 opposite radiator substrate 610. In this embodiment, each feed structure 635 comprises two coplanar strip (CPS) feed lines 631, 632. Feed structure 635 may also include, for example, one or more balanced feed lines, differential feed lines, and/or dipole structures. There is a slot 625 located between each radiator 615 and each dipole structure 631, 632 of the corresponding feed structure 635, such that each radiator 615 overlays at least a portion of dipole structures 631, 632, as well as the slots 625 associated with each of dipole structures 631, 632.

Isolation plane 645 has groups of two pads 641, 642 formed thereon, such that each pad corresponds to a component of feed line structure 635. Pad 641 corresponds to dipole structure 631 and pad 642 corresponds to dipole structure 535. Moreover, there is a via 649 formed in insulation substrate 640 between each pad 641, 642 on isolation plane 645 and each component (e.g., feed lines 631 and 632) of feed structure 635 on feed line substrate 630. Radiator 615 does not overlay pads 641, 642.

It will be appreciated and should be understood that the exemplary embodiments of the invention described above can be implemented in a number of different fashions. Given the teachings of the invention provided herein, one of ordinary skill in the related art will be able to contemplate other implementations of the invention. For example, the microstrip feed lines can be replaced with other planar lines, such as stripline, coplanar waveguide, dielectric waveguide, and similar. Likewise, antenna bandwidth may be improved by stacking another radiator (including a substrate) on top of the existing radiator.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. An antenna array comprising:
   at least a first and a second substrate;
   a plurality of radiators located proximate to a surface of the first substrate opposite the second substrate;
   at least a first ground plane located between the first and the second substrate, the ground plane having a plurality of slots located therein; and
   a plurality of feed lines located proximate to a surface of the second substrate opposite the first substrate;
   wherein at least a subset of the plurality of feed lines have at least one feed pad adjacent thereto and associated therewith.

2. The antenna array of claim 1, wherein at least a portion of a given one of the plurality of radiators overlays at least one of the plurality of slots and at least a portion of at least one of the plurality of feed lines; and
   wherein at least a portion of a given one of the plurality of slots overlays at least a portion of one of the plurality of feed lines.

3. The antenna array of claim 1, wherein at least a subset of the plurality of feed lines comprises at least one coplanar waveguide.

4. The antenna array of claim 1, wherein at least a subset of the plurality of feed lines comprises at least one dipole structures feed.

5. The antenna array of claim 1, wherein at least a subset of the plurality of feed lines comprises at least one coplanar strip.

6. The antenna array of claim 1, wherein at least a subset of the plurality of feed lines comprises at least one balanced feed.

7. The antenna array of claim 1, wherein at least a subset of the plurality of feed lines comprises at least one differential feed.

8. The antenna array of claim 1, wherein the at least a portion of the at least one radiator does not overlay the at least one feed pad.

9. The antenna array of claim 1, further comprising at least one via between the at least one feed pad and the first ground plane.

10. An antenna array comprising:
at least a first and a second substrate;
a plurality of radiators located proximate to a surface of the first substrate opposite the second substrate;
at least a first ground plane located between the first and the second substrate, the ground plane having a plurality of slots located therein;
a plurality of feed lines located proximate to a surface of the second substrate opposite the first substrate;
at least a third substrate such that the second substrate is between the first substrate and the third substrate; and
at least a second ground plane located proximate to a surface of the third substrate opposite the second substrate, the second ground plane having at least one feed pad located thereon.

11. The antenna array of claim 10, wherein the at least a portion of the at least one radiator does not overlay the at least one feed pad on the second ground plane.

12. The antenna array of claim 10, further comprising at least one via between the feed line and a corresponding feed pad on the second ground plane.

13. The antenna array of claim 10, wherein at a subset of the plurality of feed lines have at least one feed pad adjacent thereto and associated therewith, and further comprising and at least one via between each feed pad associated with the feed line and a corresponding feed pad on the second ground plane.

14. An antenna array comprising:
at least a first and a second substrate;
a plurality of radiators located proximate to a surface of the first substrate opposite the second substrate;
at least a first ground plane located between the first and the second substrate, the ground plane having a plurality of slots located therein;
a plurality of feed lines located proximate to a surface of the second substrate opposite the first substrate; and
at least one feed pad located on either side of at least a subset of the feed lines;
wherein each of the plurality of slots corresponds to one of the plurality of feed lines; at least a portion of each slot overlays at least a portion of the corresponding feed line; each feed line is associated with one of the plurality of radiators; each of the plurality of radiators has at least one feed line associated therewith; at least a portion of each of the plurality of radiators overlays at least a portion of each associated feed line; and at least a portion of each of the plurality of radiators overlays each slot corresponding to each associated feed line.

15. The antenna array of claim 14, wherein the radiator associated with each of the subset of the feed lines does not overlay the at least one feed pad located on either side of the feed line.

16. The antenna array of claim 14, further comprising at least one via between the at least one feed pad and the first ground plane.

17. An antenna array comprising:
at least a first and a second substrate;
a plurality of radiators located proximate to a surface of the first substrate opposite the second substrate;
at least a first ground plane located between the first and the second substrate, the ground plane having a plurality of slots located therein;
a plurality of feed lines located proximate to a surface of the second substrate opposite the first substrate;
at least a third substrate such that the second substrate is between the first substrate and the third substrate; and
at least a second ground plane located proximate to a surface of the third substrate opposite the second substrate, the second ground plane having at least one feed pad located thereon;
wherein each of the plurality of slots corresponds to one of the plurality of feed lines; at least a portion of each slot overlays at least a portion of the corresponding feed line; each feed line is associated with one of the plurality of radiators; each of the plurality of radiators has at least one feed line associated therewith; at least a portion of each of the plurality of radiators overlays at least a portion of each associated feed line; and at least a portion of each of the plurality of radiators overlays each slot corresponding to each associated feed line.

18. The antenna array of claim 17,
wherein each feed line corresponds to at least one feed pad on the second ground plane.

19. The antenna array of claim 18, wherein the radiator associated with a given feed line does not overlay the at least one feed pad on the second ground plane corresponding to the given feed line.

20. The antenna array of claim 18, further comprising at least one via between at least a given feed line and the at least one feed pad on the second ground plane corresponding to the given feed line.

* * * * *